United States Patent [19]

Clemen et al.

[11] 4,301,381

[45] Nov. 17, 1981

[54] TTL-COMPATIBLE ADDRESS LATCH WITH FIELD EFFECT TRANSISTORS

[75] Inventors: Rainer Clemen, Boeblingen; Joerg Gschwendtner, Esslingen; Werner Haug, Boeblingen, all of Fed. Rep. of Germany

[73] Assignee: International Business Machines Corporation, Armonk, N.Y.

[21] Appl. No.: 66,595

[22] Filed: Aug. 14, 1979

[30] Foreign Application Priority Data

Sep. 6, 1978 [DE] Fed. Rep. of Germany ....... 2838817

[51] Int. Cl.³ .......................... H03K 5/00; H03K 3/356
[52] U.S. Cl. .................................... 307/475; 307/264; 307/279
[58] Field of Search ............. 307/251, 244, 279, 264, 307/DIG. 1, 261, 238; 365/154, 205, 230

[56] References Cited

U.S. PATENT DOCUMENTS

| | | | |
|---|---|---|---|
| 3,969,706 | 7/1976 | Proebsting et al. | 307/DIG. 1 |
| 4,000,413 | 12/1976 | Wong et al. | 307/279 X |
| 4,038,567 | 7/1977 | Lewis et al. | 307/DIG. 1 |
| 4,104,733 | 8/1978 | Satoh | 307/238 X |
| 4,149,099 | 4/1979 | Nagami | 307/279 |

OTHER PUBLICATIONS

IBM-TDB "Address Buffer True/Complement Generator", A. Furman, vol. 18, No. 11, Apr. 1976, pp. 3597-3598.
IBM-TDB, "Bipolar Logic Level to FET Logic Level Buffer Circuit", S. Lewis et al., vol. 19, No. 8, Jan. 1977, pp. 2953-2954.
IBM-TDB "True and Complement High Level Signal Circuit", Parikh, vol. 20, No. 3, Aug. 1977, pp. 954-955.

*Primary Examiner*—John Zazworsky
*Attorney, Agent, or Firm*—Theodore E. Galanthay

[57] ABSTRACT

Disclosed is a field effect transistor (FET) circuit for accepting a bipolar transistor logic level input signal and providing FET logic level output signals (both in-phase and out-of-phase components). The FET circuit includes a gated latch with means for pre-charging first and second nodes to an FET logic up level. One of the two nodes is brought to a slightly higher or lower level (depending on the binary value of the input), thereby producing a latent imbalance in the latch. A gating signal causes the latch to switch into the state pre-set by the latent imbalance.

6 Claims, 2 Drawing Figures

TTL-COMPATIBLE ADDRESS LATCH WITH FIELD EFFECT TRANSISTORS

DESCRIPTION

1. Technical Field

This invention relates to a field effect transistor (FET) address latch which is compatible with voltage levels utilized in transistor transistor logic (TTL).

It is a principal object of this invention to provide a field effect transistor circuit capable of accepting binary voltage levels of much smaller amplitude than normally required for the operation of such field effect transistor circuits.

It is another object of this invention to provide an improved field effect transistor circuit for converting bipolar transistor logic levels to field effect transistor logic levels.

It is a still a further object of this invention to provide an improved field effect transistor circuit capable of receiving a single low level logic input signal and providing both the true and complement values of the logic input level at field effect transistor logic levels.

Lastly, it is an object of this invention to provide an improved field effect transistor address latch for an integrated semiconductor memory fabricated from field effect transistors.

2. Background Art

Integrated semiconductor memories used in present day data processing systems are primarily fabricated in field effect transistor (FET) technology. Semiconductor memories, however, are one part of a data processing system which uses integrated circuits fabricated in bipolar transistor technology, e.g. for high speed registers, logic circuits, etc. For the compatible operation of a complex network including both bipolar and field effect components, logic level conversions are required. Since the above mentioned FET memory components receive, in typical cases, their input signals from the outputs of bipolar components, there always appears at these interfaces the problem of the associated logic voltage level conversion.

A voltage level scheme typical for circuit concepts with bipolar transistors is the so-called TTL level scheme. According thereto, one binary state, e.g. the logic "Zero" is represented by a voltage value ranging from 0 to 0.6 V, and correspondingly the other binary state, e.g. the logic "One" is represented by a voltage value between 2.4 V and the power supply voltage of e.g. 5 V. Compared therewith, the controlling and operating voltages typical for MOSFET circuits are considerably higher. Consequently, a MOS field effect transistor (with a typical threshold voltage of 1.5 V) receiving an up level logic signal of 2.4 V (worst case) is barely urged into conduction. In other words, a thus controlled field effect transistor would in its conductive state still represent a relatively high impedance, and the required discharge of another capacitive node would be very slow. For this reason, the prior art provided separate interface driver chips fabricated in bipolar technology between bipolar and FET chips, with output voltage tailored to the input characteristics of the FET chips. However, in the course of further development the demand for FET memory chips that are fully TTL-compatible with their off chip terminals has been increasing. This advance permits the design of an overall system to ignore level interfaces in the course of the signal path, e.g. of the address and data channels. In other words, interface driver chips added additional undesired delay; while TTL-compatible FET chips do not add delay.

In addition to the conversion of the TTL signals to the internally required FET voltages or voltage swings, respectively, the input circuits of such TTL-compatible FET memory chips should split the data and address signals at the inputs into opposite phase signals. This is desirable because the control of the decoding or data driver circuits generally requires the respective signal in the "true" and in the "complementary" form, and also due to the limited number of input pads available, this phase splitting is executed in the respective chip.

The present invention lies in the field of such TTL-compatible input circuits which can be made in MOSFET technology and which perform the described level conversion and phase-splitting of the input signals. Known circuits of this type are e.g. described under the title "Address Buffer True/Complement Generator" by A. Furman in IBM Technical Disclosure Bulletin, Vol 18, No. 11, of April 1976 on pp. 3597/3598, and under the title "True and Complement High Level Signal Circuit" by G. H. Parikh, published in the IBM Technical Disclosure Bulletin, Vol. 20, No. 3 of August 1977, on pp. 954 to 956. Both circuits use FET-inverter stages for the phase-splitting of the address and data signals, and so-called bootstrap drivers for reaching the high FET-voltage levels required. The resultant opposite phase signal states are fixed in a latch at the output side. The article "Bipolar Logic Level to FET Logic Level Buffer Circuit" by S. C. Lewis et al. in the IBM Technical Disclosure Bulletin, Vol. 19, No. 8 of January 1977, on pp. 2953/2954 describes such a circuit for level conversion and phase-splitting, where the input signal is directly applied to an input-side gated latch (flipflop). In spite of the increase of the switching speed due to the utilization of the latching effect this circuit is not yet fully satisfactory, either, for particularly high speeds on the one hand, and because of the additionally required auxiliary and reference voltages on the other.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

The invention as disclosed and claimed herein overcomes the above-described problems associated with prior art circuits. More particularly, the present circuit provides rapid switching and avoids signal path delays in the conversion of a single ended bipolar level logic signal to a true/complement FET level logic signal. The objects, features, and advantages of the invention are provided by a unique combination of field effect transistors as described in greater detail herein below.

Figure 1:
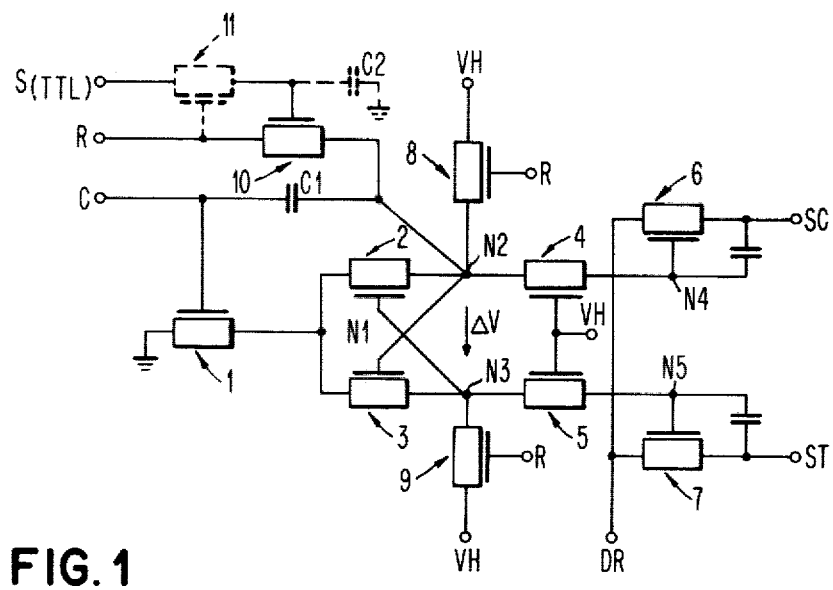
FIG. 1 is a schematic circuit diagram of an embodiment of the invention.
Figure 2:
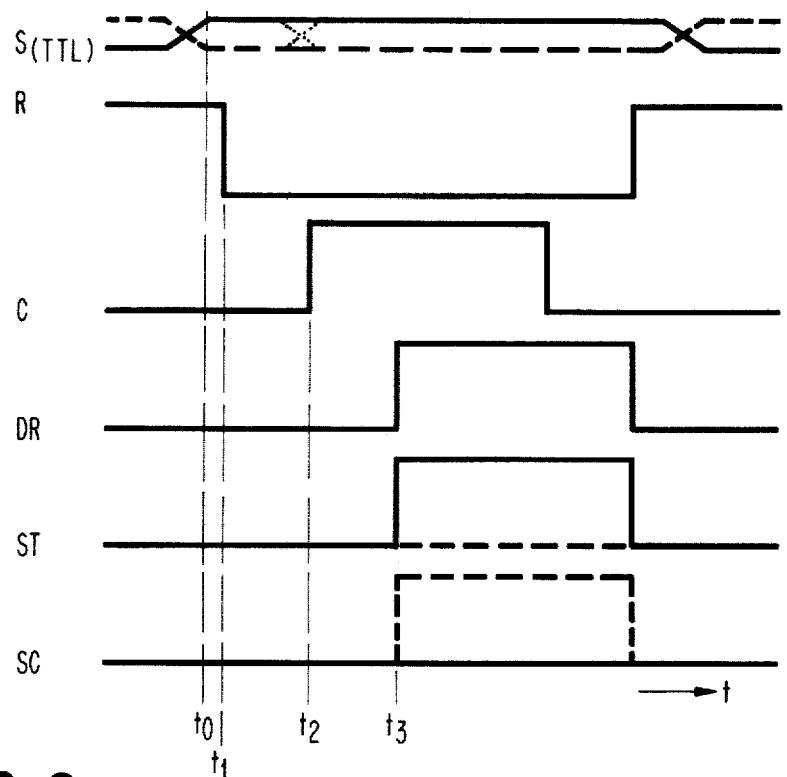
FIG. 2 is a wave form diagram descriptive of the operation of the circuit of FIG. 1.

A relatively small difference (bipolar voltage level) input signal causes an imbalance in a pair of latch nodes that were previously precharged to equal potential levels. The precharge level is as close as possible to the up level FET logic voltage. Once the nodes have been imbalanced, a clock pulse rapidly sets the latch nodes to full FET logic levels in a race mode type of operations. In this manner a small imbalance in the latch nodes is rapidly converted (and thereby amplified) to FET logic levels by the highly biased and therefore highly conductive field effect transistors of the latch. Bootstrap drivers electrically connected to the latch nodes provide both the true and complement output signals at full FET logic levels. A particular further advantage of this invention is that the low level logic input signal is gated to the latch nodes so tha subsequent variations in the low level input signal do not disturb the desired slight imbalance provided to the latch node. An up level TTL signal brings one of the balanced latch nodes to a lower potential level. Means are also provided for bringing the same latch node to a higher voltage level in case a down level TTL logic signal is received. This is achieved by a clock signal capacitively coupled to the said same node. The clock signal utilized for this purpose is the same clock signal which initiates the race condition in the setting of the latch. The embodiment of the invention as shown in FIG. 1 utilizes conventional N-channel MOS field effect transistors whose operating voltage VH is in typical cases approximately ±8.5 V. However, the invention can be equally realized with field effect transistors of the other conductivity type (p-channel), and with a correspondingly altered operating voltage. Furthermore, the waveforms of FIG. 2 are of a merely qualitative nature.

FIG. 1 designates with S the TTL input signal which is to be converted into FET voltage levels (ground, VH), and from which the associated true output signal ST as well as the associated complementary output signal SC is to be produced. This TTL input signal S is e.g. an address signal which is employed in the decoding of a specific storage cell on the storage chip. The other control pulses R, C and DR are already at full FET levels. These control pulses are in general also produced internally from one single externally applied chip selection signal with TTL levels. Control pulse R substantially determines the restore phase during which the circuit is set to defined inttial conditions. C activates the circuit functions on the chip and e.g. in the present case sets the address gate. DR is the control pulse for the activation of the output drivers. The generation of control pulses R, C and DR at FET voltages and at the time intervals indicated in FIG. 2 can be performed with conventional and well-known FET clock pulse generating circuits.

It is to be noted that the time required for the level conversion and phase-splitting of input signal S is cumulatively included in the resulting access time for a memory cell on the respective chip. If signals ST/SC can be generated from input signal $S_{(TTL)}$ in a shorter time, then there is a resultant advantageous reduction in the overall access time.

For a detailed description of the circuit in accordance with FIG. 1, the basic structure of such an address latch can be considered conventional. Transistors 1, 2 and 3 form a so-called gated flipflop whose latch nodes N2 and N3 are coupled via isolation transistors 4 and 5 to the gate electrodes of transistors 6 and 7, respectively. Of particular importance in the present invention is the circuit design of the one-sided control of node N2, and of the charging of the two nodes N2 ad N3 in the standby phase via transistors 8 and 9. Node N2 is connected via the source-drain path of field effect transistor 10 to the input for control pulse R. At the gate of transistor 10, TTL input signal S is applied through FET 11. A capacitive coupling is furthermore provided to the same node N2 via C1 from the input for control pulse C.

For a further explanation of the circuit of FIG. 1 and its operation, reference is also made to FIG. 2. In the standby phase, control pulse R is at its up level and nodes N2, N3, N4 and N5 are charged from the voltage source VH to the potential VH-VT. Similarly, node N1 is charged to the value VH-2VT. VT is the threshold voltage of the field effect transistors which in the present case are considered to be equal. The latch nodes N2 and N3 should be precharged in the standby phase to a maximum voltage which should in particular be higher than the voltage value for the highest TTL input signal level. Also, in the standby phase, the C-control pulse is at approximately 0 V and transistor 1 is non-conductive. As driver pulse DR is also at 0 V, outputs ST and SC are kept at ground potential via conductive transistors 6 and 7. Transistor 10, which is arranged in the one control branch for node N2 and at whose gate TTL input signal S is applied is always non-conductive in the standby phase since drain and source of transistor 10 have a higher potential than the gate. In the standby phase therefore, input signal S does not have any influence on the circuit.

It is now assumed that at time $t_0$ input signal (address signal) S has reached its valid value. If subsequently, control pulse R decreases at time $T_1$ ($t_1 - T_0 \geq 0$) to ground potential, transistors 8 and 9 are turned off so that latch nodes N2 and N3 are disconnected from operating voltage source VH. At this point, latch nodes N2 and N3 are "floating". If it is assumed that input signal S is in the upper binary state, i.e. that it shows a voltage value that is higher than, or equal to 2.4 V, field effect transistor 10 is rendered conductive by the downgoing transition of R to ground potential. Current flow through transistor 10 generates a differential signal $\Delta V$ across latch nodes N2 and N3 so that a clear setting of the flipflop is ensured later on.

Prior to the appearance of the C-control pulse at time $t_2$ therefore, a latent asymmetry depending on the input signal state has been generated by lowering the N2 potential. With the appearance of the C-control pulse the fipflop is set. The latching effect amplifies the initially low $\Delta V$ value to the full FET level difference. In other words, latch node N2 and also node N4 are practically discharged to ground potential via conductive transistors 1 and 2. However, the potential of nodes N3 ad N5 remains at the upper value and transistor 7 remains conditioned conductive. If at time $t_3$ driver pulse DR changes from ground potential to VH, there appears in the driver stage with transistor 7 the known bootstrap effect, and output ST also adopts the VH potential. SC remains at ground potential for the input state assumed here.

If at the beginning of the selection process input signal S is in its lower binary state, i.e. $\leq 0.6$ V, field effect transistor 10 continues to be non-conductive upon the switching off of R at time $t_1$. Thus, there is no potential decrease at node N2 through a discharge current via transistor 10. Both latch nodes N2 and N3 remain in this case at the same potential to which they had been precharged before; a differential voltage between N2 and N3 is not charged yet at this time. When the C-control pulse appears at time $t_2$, however, just a sufficient amount of charge is coupled via C1 to node N2 to allow a latent asymmetry to be formed in a direction opposite to the above described case. In particular, the potential at N2 is increased with respect to N3. The occurrence of the C-control pulse proceeds to set the flipflop, causing node N3 and thus node N5 to be discharged to approximately ground potential. When driver pulse DR is activated, the above described bootstrap effect now takes place in the drive stage with transistor 6, so that SC goes to VH potential, and ST remains at approximately ground potential.

Field effect transistors 4 and 5 are used for insulating the respective bootstrapping circuit node N4 or N5, since otherwise the capacitance of node N2 or N3 would be a disturbing parasitic capacitance for the bootstrap process. A cycle is terminated by switching the C-control pulse to a down level, thereby turning transistor 1 off to prevent unnecessary DC power dissipation.

If in accordance with FIG. 1, and in the manner shown there by dashed lines, the above described circuit includes optional transistor 11 and a capacitor C2, the circuit additionally permits the state of the TTL input signal S to be altered prior to the end of the selection cycle. Field effect transistor 11 is controlled at its gate by the R-pulse. At a time at which S has to show its definite binary value ("Zero" or "One") transistor 11 is fully conductive (R is up) and the input signal is directly connected to both the gate of transistor 10 and to capacitor C2. The function of C2 is to stabilize the voltage at the gate of transistor 10 when transistor 11 is switched off. If at the end of the standby phase control pulse R is switched off, input signal S no longer affects the remaining circuit parts of the address latch because transistor 11 is then no longer conductive. On the associated input line for the TTL address signal it will then already (i.e. for $t > t_1$) be permissible to change potential levels, a very advantageous feature. Such an input signal change is shown, by way of example in FIG. 2 waveform $S_{(TTL)}$ by dotted lines.

As pointed out above, the present invention utilizes the sensitivity and amplification of a latch circuit operated in a "race" mode. This is accomplished by an input signal state setting oppositely directed asymmetries in the latent flip-flop. The two input states to be distinguished affect differential voltages with opposite polarity between the crosscoupled nodes of the latch circuit. By controlling only one side of a latch, the potential level of one of the latch nodes is lowered in one case by a relatively low discharge current, and raised in the other case through the coupling-in of a small charge. The pre-setting thus performed in the inactive or insulated state of the flipflop is then latched finally when the flipflop is set.

In the circuit design for controlling the latch node, e.g. N2 in FIG. 1, via transistor 10 and capacitor C1, the rise of potential taking place via C1 upon the appearance of the C-control pulse must be kept smaller than the potential decrease that has possibly taken place previously via field effect transistor 10. In other words, the design of the control branch with 10 and C1 has to insure that if there is an up level input signal S, the discharge effect via transistor 10 is higher than the potential increase taking place via C1. A typical value for the potential decrease through the discharge via transistor 10 is approximately in the order of 0.3 V. Typical for the differential voltage obtained through a potential increase via C1 is a value of 0.15 V. If consequently a specific value $\Delta V$ is assumed for the potential decrease the corresponding values for the necessary discharge current through transistor 10, or the duration thereof can be obtained on the basis of the capacitance values being effective at the respctive node, e.g. N2. Typical values are approximately a discharge current of 40 $\mu$A over a time of e.g. 15 ns. This discharge time available at node N2 for a voltage decrease corresponds to the time difference $t_2 - t_1$ in FIG. 2. From the value for the discharge current to be accepted, the respective geometry (W/L) of transistor 10 can be determined, with given voltage levels for R and S, e.g. 35/3.5. In the same manner, with a given $\Delta V$ for the voltage rise via C1 the associated value for C1 can be determined from the stray capacitance effective at the latch node, the levels for control pulse C, as well as from the flipflop parameters. A value which is typical under the above specified conditions is approximately 0.075 pF.

It should finally be pointed out that owing to the high and uniform precharge of the latch nodes N2 and N3 to almost the operating voltage VH, transistor 2 or 3 switched on upon the setting of the flipflop—contrary to known circuits of this type with a lower pre-charge of the latch nodes—will immediately have a very low impedance and will permit a quick and complete discharge of the respective latch node.

In summary, the present invention presents a high speed circuit for the conversion of TTL signals into signals with FET levels which are simultaneously split into opposite phase signals. The circuit presents a low input capacity for the TTL signals since with their help only a relatively small differential signal but not a full VH voltage swing has to be generated. The disclosed address latch can furthermore operate with a minimum of control pulses and auxiliary voltage sources and does not have any DC power dissipation.

Another advantageous feature of the design in integrated circuit technology is the small amount of semiconductor surface area required since the input signal is applied to one field effect transistor only which does not have to be very large. Furthermore, the circuit can be supplemented in a simple manner in that the applied input signals have to be valid for a relatively short period only, and that their potential can alter before the termination of the selection process.

While we have illustrated and described the preferred embodiment of our invention it is to be understood that we do not limit ourselves to the precise construction herein disclosed and the right is reserved to all changes and modifications coming within the scope of the invention as defined in the appended claims.

Having thus described the invention, what is claimed as new, and desired to be secured by Letters Patent is:

1. A field effect transistor circuit, for converting first and second relatively low logic voltage levels to first and second relatively higher logic voltage levels, comprising:

first and second field effect transistors having drain, source, and gate electrodes, their drain and gate electrodes being respectively cross coupled forming first and second latch nodes, their source electrodes being connected in common;

first circuit means connected to the first and second latch nodes for precharging the first and second latch nodes to the first relatively higher logic level from a first potential source;

a third field effect transistor having drain, source, and gate electrodes for selectively isolating the common source connection of said first and second field effect transistors from a second potential source;

an input terminal for receiving said first and second relatively low logic voltage levels;

second circuit means for coupling said input terminal to said first latch node;

a control terminal for receiving a clock pulse signal; and capacitive means for coupling the control terminal only to the first latch node and not to the second latch node such that the occurrence of a clock pulse at said control terminal causes charge to be coupled only to said first latch node.

2. A field effect transistor circuit as in claim 1 wherein said second circuit means comprises:

a fourth field effect transistor having drain, source, and gate electrodes, the source to drain path of said fourth field effect transistor being connected between another control terminal and said first latch node, the gate electrode being coupled to the input terminal.

3. A field effect transistor circuit as in claim 2 further comprising:

a fifth field effect transistor having drain, source, and gate electrodes, the drain to source path being connected between the input terminal and the gate electrode of said fourth field effect transistor, the gate electrode of the fifth field effect transistor being electrically connected to said another control terminal.

4. A field effect transistor circuit as in claim 3 further comprising:

another capacitive means electrically connected to the gate electrode of said fourth field effect transistor.

5. A field effect transistor circuit as in claim 1 further comprising:

a fourth field effect transistor having drain, source, and gate electrodes, its drain to source path being connected between said first latch node and a first bootstrap circuit;

a fifth field effect transistor having drain, source, and gate electrodes, its drain to source path being connected between said second latch node and a second bootstrap circuit; and the gate electrodes of said fourth and fifth field effect transistors being connected in common to said first potential source.

6. A field effect transistor circuit as in claim 5 wherein said first and second bootstrap circuits respectively comprise:

sixth and seventh field effect transistors having drain, source, and gate electrodes, each having a gate to source bootstrap capacitor and each having its drain electrode connected to another control terminal, the gate electrode of the sixth field effect transistor being connected to the fourth field effect transistor, the gate electrode of the seventh field effect transistor being connected to the fifth field effect transistor, the source electrode of the sixth field effect transistor being connected to a complementary output terminal, the source electrode of the seventh field effect transistor being connected to a true output terminal.

* * * * *